(12) United States Patent
Posseme et al.

(10) Patent No.: US 10,242,870 B2
(45) Date of Patent: Mar. 26, 2019

(54) METHOD FOR PRODUCING PATTERNS

(71) Applicant: COMMISSARIAT A L'ENERGIE ATOMIQUE ET AUX ENERGIES ALTERNATIVES, Paris (FR)

(72) Inventors: Nicolas Posseme, Sassenage (FR); Stefan Landis, Tullins (FR); Lamia Nouri, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/606,626

(22) Filed: May 26, 2017

(65) Prior Publication Data
US 2017/0345655 A1 Nov. 30, 2017

(30) Foreign Application Priority Data
May 27, 2016 (FR) .................... 16 54822

(51) Int. Cl.
*H01L 21/302* (2006.01)
*H01L 21/02* (2006.01)
(Continued)

(52) U.S. Cl.
CPC ...... *H01L 21/02694* (2013.01); *G02B 3/0012* (2013.01); *H01L 21/02304* (2013.01);
(Continued)

(58) Field of Classification Search
CPC ........... H01L 21/02304; H01L 21/0332; H01L 21/32137; H01L 21/3083
(Continued)

(56) References Cited

U.S. PATENT DOCUMENTS 6,207,517 B1 3/2001 Muller
2001/0000159 A1* 4/2001 Muller .................. H01L 21/266
438/689
(Continued)

FOREIGN PATENT DOCUMENTS

FR 3 028 350 A1 5/2016
WO WO 2014/102222 A1 7/2014
WO WO 2016/075083 A1 5/2016

OTHER PUBLICATIONS

French Preliminary Search Report dated Feb. 15, 2017 in French Application 16 54822 filed on May 27, 2016 (with English Translation of Categories of Cited Documents and Written Opinion).
(Continued)

*Primary Examiner* — Binh X Tran
(74) *Attorney, Agent, or Firm* — Oblon, McClelland, Maier & Neustadt, L.L.P.

(57) ABSTRACT

A method for producing patterns in a layer to be etched, from a stack including at least the layer to be etched and a masking layer overlying the layer to be etched, with the masking layer having at least one pattern. The method includes modifying a first area of the layer to be etched by ion implantation through the masking layer; depositing a buffer layer to cover the pattern of the masking layer; modifying another area of the layer to be etched, different from the first area, by ion implantation through the buffer layer, to a depth of the layer to be etched greater than the implantation depth of the preceding step of modifying; removing the buffer layer; removing the masking layer; removing the modified areas by etching them selectively to the non-modified areas of the layer to be etched.

15 Claims, 8 Drawing Sheets

(51) Int. Cl.
    *H01L 21/033*     (2006.01)
    *H01L 21/3213*    (2006.01)
    *G02B 3/00*       (2006.01)
    *G03F 7/00*       (2006.01)
    *H01L 21/306*     (2006.01)
    *H01L 21/308*     (2006.01)
(52) U.S. Cl.
    CPC ........ *H01L 21/033* (2013.01); *H01L 21/3213* (2013.01); *G03F 7/0005* (2013.01); *H01L 21/3083* (2013.01); *H01L 21/30608* (2013.01)
(58) Field of Classification Search
    USPC ....... 438/717, 719, 736, 738; 216/62, 72, 79
    See application file for complete search history.

(56) References Cited

U.S. PATENT DOCUMENTS

| | | | |
|---|---|---|---|
| 2012/0034749 A1* | 2/2012 | Lim | H01L 21/823412 438/303 |
| 2013/0045589 A1* | 2/2013 | Kim | H01L 21/26506 438/478 |
| 2014/0187046 A1* | 7/2014 | Posseme | H01L 21/0217 438/696 |
| 2016/0035581 A1 | 2/2016 | Posseme et al. | |
| 2017/0250278 A1* | 8/2017 | Tsai | H01L 29/7833 |

OTHER PUBLICATIONS

Jorge Albero et al. "Fabrication of spherical microlenses by a combination of isotropic wet etching of silicon and molding techniques," Optical Society of America, 2009, pp. 10.

H. Ottevaere et al. "Comparing glass and plastic refractive microlenses fabricated with different technologies," Journal of Optics A: Pure and Applied Optics 8, issue 7, 2006, pp. 23.

Yung-Chun Lee et al. "Spherical and Aspheric Microlenses Fabricated by Excimer Laser LIGA-like Process," Journal of Manufacturing Science and Engineering, vol. 129, Issue 1, 2006, pp. 2.

* cited by examiner

Prior Art

Prior Art

Prior Art
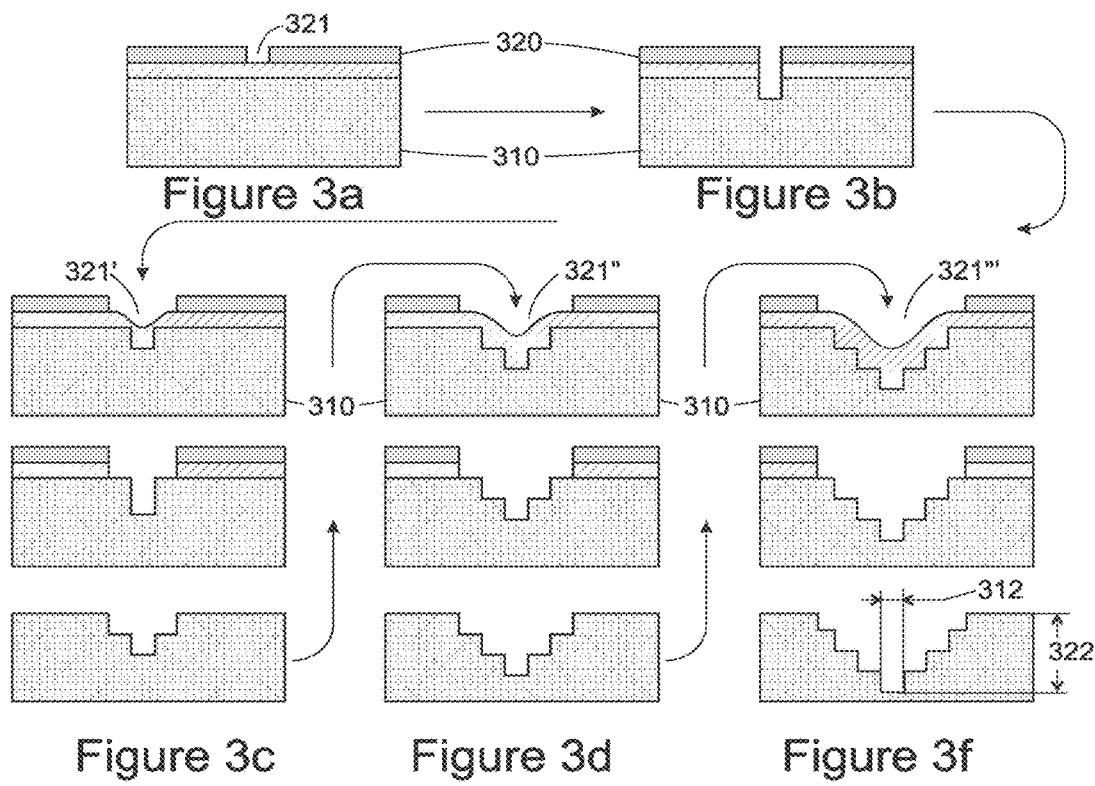
Figure 3a  Figure 3b
Figure 3c  Figure 3d  Figure 3f
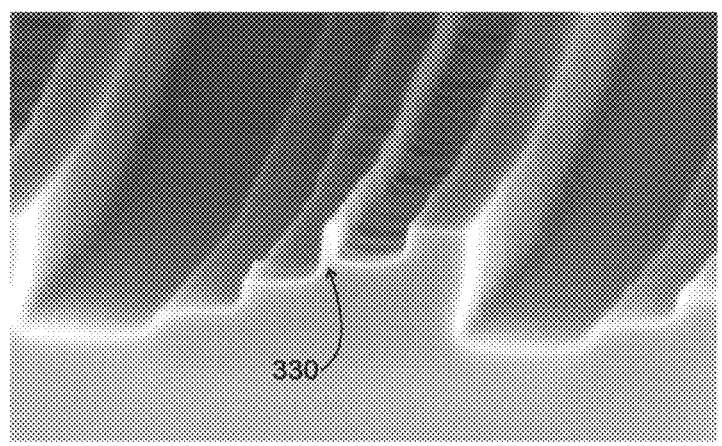
Figure 3e

METHOD FOR PRODUCING PATTERNS

TECHNICAL FIELD OF THE INVENTION

The invention in general relates to the production of structures in the field of methods used by the microelectronics industry for the manufacture of all sorts of systems, of micrometric and nanometric size, possibly combining electronic, optical and mechanical components.

More precisely, it relates to methods in which it is necessary to align patterns with respect to other patterns produced beforehand.

The invention has for particularly advantageous application the production of aspherical microlenses intended for light collecting applications, imaging and guiding light. It also has as an advantageous application the production of structures referred to as "dual damascene" for the vertical interconnection of metal lines in particular made of copper.

PRIOR ART

For many applications, it is necessary to produce patterns aligned on other patterns defined beforehand during preceding operations of photolithography and etching.

The constant reduction on the dimensions of patterns then poses the difficulty of managing to effectively align the patterns with enough precision during successive operations of photolithography.

This problem is particularly important for the production of microlens arrays used in many optoelectronic devices. In this field there are already many manufacturing methods. A review of the known manufacturing techniques for microlenses can for example be found in the following publication: "Journal of Optics A: Pure and Applied Optics 8, issue 7" pages 407-429, published in 2006.

Among the latter, microjet printing and thermal reflow are now very advanced techniques that are used in industry to produce microlenses of high optical quality. However, these techniques are more qualitative than quantitative when it entails reaching a predetermined surface profile intended to provide the lenses with the expected optical properties. For example, thermal reflow of photo-resin and microjet printing are based on the surface tensions which substantially limit the choice of the surface profiles that can be obtained in practice with these techniques.

Other known techniques such as laser ablation, two-photon polymerization and direct laser inscription make it possible to obtain a very large choice of surface profiles, but are sequential techniques that demand that each lens of a matrix be individually shaped. This results in that these techniques are not applicable in terms of costs and output at an industrial scale.

More recently, the techniques of molding and printing such as those generally designated as "hot embossing", "imprinting" and "injection molding" have been used extensively to produce microlenses. The manufacturing principle, shown in FIGS. 1a and 1b, is to fill a mold 100 with a malleable material, typically a polymer, and then to detach 130 the latter from the molded material 120. FIG. 1b shows that the microlenses obtained this way can be of hemispherical 140 and aspherical 150 shapes. According to the type of substrate 110 whereon the molding is done, made of silicon according to an embodiment or of quartz or glass according to another embodiment, the applications can relate to, respectively, the range of infrared wavelengths (IR) or that of visible light.

The manufacturing methods by imprinting require having molds that can themselves be manufactured for example using techniques mentioned in the publication mentioned hereinabove ("Journal of Optics"). As a general rule, the standard techniques implemented by the microelectronics industry are most often preferred as they are very reliable and the integration of the microlenses into the final components, typically electronic components of the transistor type, is facilitated. FIGS. 2a, 2b, and 2e show a manufacturing example of a mold. As shown in FIG. 2a, after deposition of a layer 102 of thermal silicon (SiO2) or silica, for example of a thickness of 20 micrometers (μm), on a wafer of the type of those commonly used by the microelectronics industry, i.e. a wafer of 103 silicon of large diameter, for example of a diameter of 8 inches, a layer 101 of silicon nitride (Si3N4), for example of a thickness of 350 nanometers, is deposited onto the thermal oxide layer. The patterns 104 intended to form the reliefs of the mold are first etched in the nitride layer 101 using conventional steps of lithography (FIG. 2a). The wafer is then immersed in a wet etching solution, for example a solution with a hydrofluoric acid (HF) base. As shown in FIG. 2b, the nitride mask protects the areas of the wafer where the etching solution must not attack the layer of silica 102. The etching of the layer of silica 102 is isotropic, forming as such a cavity, in the shape of a portion of a sphere, centered on the patterns 104. In the following step shown in FIG. 2c, the nitride mask is removed and after application of an anti-stick treatment, the wafer can be used as a mold 100 for imprinting.

Optionally, the patterns in relief of the mold can be created directly in the silicon 103 without having recourse to the intermediate layer of silica 102. In this case, the etching solution is a mixture of hydrofluoric acid (HF) and of nitric acid (HNO3) as reported in 2009 in an article published in the review Optics Express, Volume 17, Edition 8, pages 6283 to 6292 (2009).

Although the methods of manufacturing the mold briefly described hereinabove are suitable for the obtaining, as represented by spherical or hemispherical patterns, it is however difficult to obtain so-called aspherical lenses of a desired shape with these methods. However, the production of arrays of aspherical microlenses is generally required in many applications. These aspherical lenses indeed usually have optical properties that are much better. In particular, spherical lenses, contrary to aspherical lenses, induce optical aberrations, with the rays passing through the center of the lens not converging exactly at the same point as those passing through the edges. This causes a blur with large openings and an enlargement of the focusing spot that is not possible to ignore in most applications.

Recourse must then be had to the use of lasers and so-called "laser machining" or laser ablation techniques, already mentioned hereinabove, which alone are able to create the complex profiles required with however the major disadvantage that each microlens then has to be shaped individually. These techniques are for example described in the article Spherical and Aspheric Microlenses Fabricated by Excimer Laser LIGA-like Process Yung-Chun Lee, Chun-Ming Chen and Chun-Ying Wu published in 2006 in the review "Journal of Manufacturing Science and Engineering" 129, 126-134.

Generally, there is no simple and fast method, i.e. which can work in a single series of steps on the scale of a wafer, also compatible with the standard techniques of microelectronics and which makes it possible to simply control the surface profile with the purpose of producing in particular aspherical lens arrays.

Another way to address the problem of creating complex profiles, such as those required for the production of aspherical lenses and also for applications other than optical applications, consists in being able to produce three-dimensional (3D) structures exhibiting steps i.e. having several discrete levels of heights as shown in FIGS. 3a to 3f. In the case of production of microlens arrays it will then be possible to approximate the desired profiles using a more or less large number of steps.

The standard method that makes it possible to produce these 3D structures exhibiting steps is complicated and requires a substantial number of steps as is shown in FIGS. 3a to 3f. It has to be possible to repeat according to the number of steps to be produced, in the number of four in the example of FIGS. 3a to 3f, a series of lithography and etching steps, shown in FIGS. 3a to 3f, which can be difficult to implement for critical dimensions 312 of patterns to be produced, typically less than the μm, and for high aspect ratios 322, typically greater than 3.

A particular difficulty consists in being able to precisely align successive steps of structuring in relation to one another. In particular, after each etching of the substrate 310, it is necessary to redeposit a layer of resin 320 and to reform a pattern aligned on the preceding pattern. As such, the patterns 321', 321", 321''' must all be aligned on the pattern 321.

If it is not possible to very precisely align the operations of corresponding photolithographies between them, etching artifacts 330 can be obtained such as the one shown in FIG. 3e which is a photograph produced using a scanning electron microscope on a 3D structure with four levels similar to those of the preceding figures. The presence of such defects is obviously very detrimental and no longer makes it possible to obtain the final profile sought.

An object of this invention is therefore to propose a method that applies on a wafer for the production of profiles and which makes it possible to overcome or at least limit at least some of the problems exposed hereinabove.

In particular, this invention has for objective to propose a simple and reliable solution in order to obtain a profile using operations of lithography that require being self-aligned and this while still offering good dimensional control.

The other objects, characteristics and advantages of this invention shall appear when examining the following description and the accompanying drawings. It is understood that other advantages can be incorporated.

SUMMARY OF THE INVENTION

In order to achieve this objective, an aspect of this invention relates to a method for producing patterns in a layer to be etched, from a stack comprising at least the layer to be etched and a masking layer overlying the layer to be etched, the masking layer having at least one pattern, with the method comprising at least:

a) a step of modifying at least one first area of the layer to be etched by ion implantation through the masking layer;

b) at least the following steps:

b1) a step of deposition of at least one buffer layer in such a way as to cover at least the pattern of said masking layer;

b2) a step of modifying at least one other area of the layer to be etched, different from the first area, by ion implantation through said buffer layer, with the implantation being carried out to a depth of the layer to be etched greater than the implantation depth of the preceding step of modifying;

c) at least one step of removing said at least one buffer layer;

d) a step of removing the masking layer;

e) a step of removing the modified areas, with the removal comprising a step of etching the modified areas selectively to the non-modified areas of the layer to be etched.

Advantageously but optionally only, the step of deposition of the buffer layer is a conformal deposition.

"Conformal" means a geometry of layers that has, to the nearest manufacturing tolerances, a constant thickness despite the changes in direction of the layers, for example on the vertical flanks of certain structures.

As such, the invention makes it possible, thanks in particular to the step of deposition of the buffer layer covering the pattern and to the implantation through the buffer layer, to define several modified areas which are automatically aligned with respect to one another. The alignment considered is along a plane parallel to the main plane that contains the layer to be etched. In the following figures this alignment is along the horizontal plane (XY on the point of reference of FIG. 4a).

The successive patterns of which the external flanks are formed by the buffer layer or layers deposited successively, are all formed on the initial pattern defined by the masking layer. As such all of the patterns used for successive implantations are therefore self-aligned.

The invention as such makes it possible to obtain a structure of which the profile is free of the aligning defects that are usually encountered with the known methods that require successive operations of lithography.

Moreover, with respect to a solution wherein the layer to be etched would be implanted in line with a hollow pattern made in the masking layer, then wherein the patterns would be enlarged via trimming before the new implantation over a lower depth, the invention has for advantage to not consume a thickness of the masking layer between two implantations. Consequently, the depth of the implantations is controlled with great precision.

The invention as such offers a simple and reliable solution for obtaining a profile that is possibly complex and which has an improved definition, optionally by repeating several times said sequence of steps b1) and b2) before the steps d) and e) of removing the masking layer and of removing the modified areas.

Another object of this invention relates to a method for producing a mold for forming aspherical lenses via nano-printing. The method comprises the steps a) to e) hereinabove and the sequence comprising at least the steps b1) and b2), possibly the step c), is repeated in such a way as to obtain a hollow profile, aspherical, formed of steps.

Another object of this invention relates to a microelectronic device produced by implementing one of the methods according to the invention. The term microelectronic device means any type of device produced with microelectronic means. These devices encompass in particular in addition to devices with a purely electronic purpose, micromechanical or electromechanical devices (MEMS, NEMS . . . ) as well as optical or optoelectronic devices (MOEMS . . . )

BRIEF DESCRIPTION OF THE FIGURES

The purposes, objects, as well as the characteristics and advantages of the invention shall appear better from the detailed description of an embodiment of the latter which is shown in the following accompanying drawings wherein:

FIGS. 3a, 3b, 3c, 3d, 3e, and 3f show a conventional method for producing a three-dimensional (3D) structure with steps.

Figure 1A:
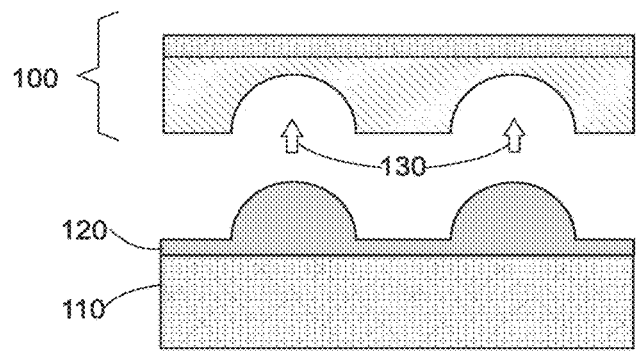
FIGS. 1a and 1b show the manufacturing principle by molding of hemispherical lenses or formed by a portion of a sphere.
Figure 1B:
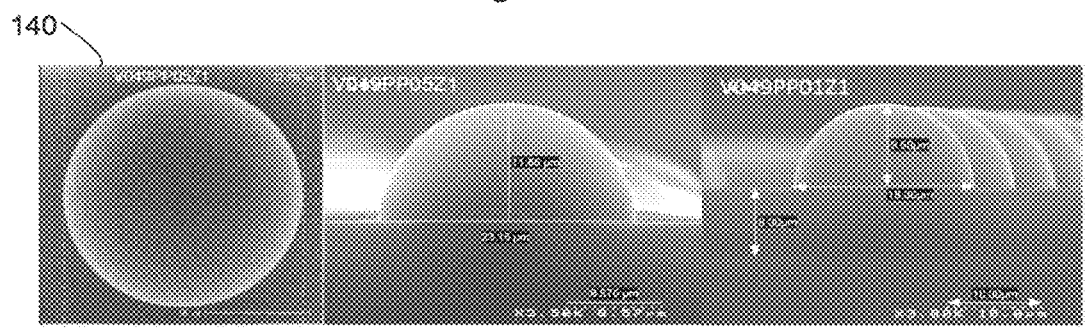
Figure 1B:
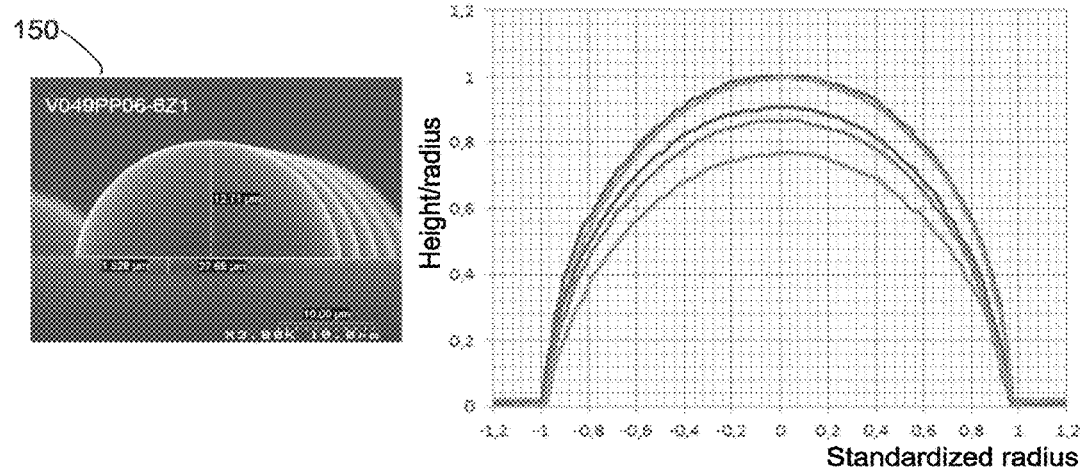
Figure 2A:
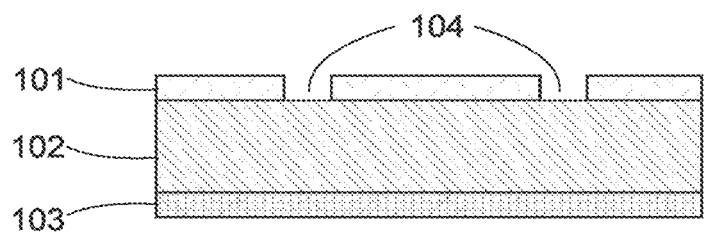
FIGS. 2a, 2b, and 2c show a manufacturing example of an imprinting mold carrying a shape in the portion of a sphere.
Figure 2B:
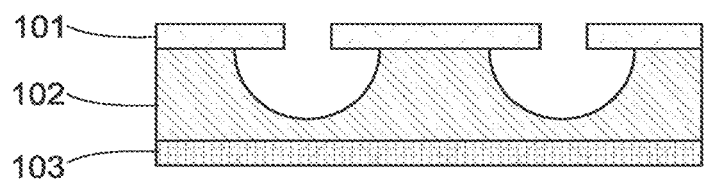
Figure 2C:
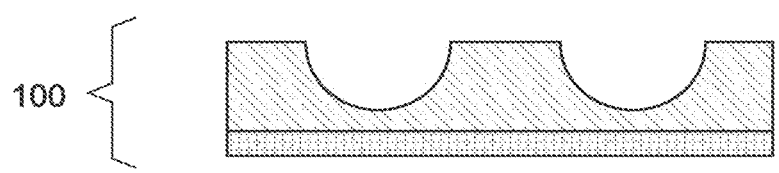

The drawings are given by way of examples and do not limit the invention. They constitute block diagram representations intended to facilitate the understanding of the invention and are not necessarily to the scale of the practical applications. In particular the relative thicknesses of the various layers and films do not represent reality.

DETAILED DESCRIPTION OF THE INVENTION

Before beginning a detailed review of embodiments of the invention, hereinafter are mentioned optional characteristics that can possibly be used in association or alternatively.

According to an embodiment, before the step c) of removing said at least one buffer layer, several times, more preferably at least two times and more preferably at least three times, a sequence of steps is carried out, with each sequence comprising the steps b1) and b2), with a buffer layer deposited during a given sequence being stacked as such on a buffer layer deposited during a sequence preceding the given sequence.

As such the buffer layers deposited are stacked on one another as the sequences unfold.

According to an embodiment a buffer layer deposited during a given sequence has a thickness that is identical to the thickness of a buffer layer deposited during a sequence preceding the given sequence. This avoids having to adjust the thickness to be deposited for each buffer layer, which facilitates the method and improves its reliability.

Moreover this embodiment makes it possible to carry out a single step of removal for removing all of the buffer layers deposited successively.

According to an alternative embodiment, before the step d) of removing the masking layer, several times, more preferably at least two times and more preferably at least three times, a sequence of steps is carried out, with each sequence comprising the steps b1), b2) and c).

More preferably a buffer layer deposited during a given sequence has a thickness greater than the thickness of a buffer layer deposited during a sequence preceding the given sequence.

As such, after each step of implantation through a buffer layer this buffer layer is removed.

According to an embodiment, said step of etching the modified areas selectively to the non-modified areas of the layer to be etched is a wet etching.

In particular wet etching saves time while still providing good dimensional control and a good surface condition. The method according to the invention is as such rapid and perfectly compliant with the industrial constraints in terms of productivity.

According to an embodiment, the pattern is a pattern in relief. The step of implantation is carried out in such a way that the area of the layer to be etched located in line with the pattern is not implanted or is implanted over a depth that is lower than the areas that are not located in line with the pattern.

Alternatively the patterns is a hollow pattern. The step of implantation is carried out in such a way that the area of the layer to be etched located in line with the pattern is implanted over a depth that is greater than the areas that are not located in line with the pattern.

According to an embodiment, the masking layer carrying the initial pattern is retained during the step of deposition of the buffer layer and during the implantation in the layer to be etched through the buffer layer.

According to an embodiment, the stack comprises an intermediate layer arranged between the masking layer and the layer to be etched and covering the layer to be etched during the implantation.

According to an embodiment, the masking layer comprises carbon and the thickness of the intermediate layer is sufficient to form a barrier that prevents, during implantations, carbon species coming from the masking layer from penetrating inside the layer to be etched.

This makes it possible to transfer with precision in the layer to be etched the patterns without carbon atoms coming from the masking layer being transferred into the layer to be etched and disturbing the etching of the latter.

According to an embodiment, the thickness of the intermediate layer is adjusted in such a way that on the modified areas the ions are implanted continuously from the surface of the layer to be etched.

Advantageously this makes it possible to use standard implanters while still having a modification of the layer to be etched continuously from its surface.

According to an embodiment, the intermediate layer is made from a material taken from the following materials: SixOy, SiOx, SixNy, SiNx, TiN, SiARC.

According to an embodiment, the intermediate layer is made of resin.

According to an embodiment, the implantation is carried out with an implanter. Preferably, the thickness of the intermediate layer is adjusted in such a way that on the modified areas the ions are implanted continuously from the surface of the layer to be etched.

According to another advantageous embodiment, the implantation is carried out in a plasma reactor. This has for advantage to be able to implanter the ions continuously from the surface of the layer to be etched.

According to an embodiment, the steps of removing the buffer layer or layers and the step of removing the masking layer are carried out during the same etching. Alternatively they are carried out during two successive etchings.

According to an embodiment, the steps b1) and b2) are chosen, in particular the thickness of the buffer layer and the implantation depth, in such a way that the modified areas form a step profile.

According to an embodiment, after the etching of a step profile in the layer to be etched a smoothing of said profile is carried out by oxidation and deoxidation of the material of the layer to be etched.

According to an embodiment, the profile has the negative of a shape of an aspherical lens.

According to an embodiment, the profile forms a mold configured to penetrate into a printable resin in order to transfer the profile therein via nano-printing.

According to an embodiment, prior to the steps a) to c), the masking layer comprises a plurality of patterns and the steps a) to c) can be applied to said plurality of patterns.

According to an advantageous embodiment, the layer to be etched is a layer or a substrate of which the material is taken from: silicon, silicon germanium, germanium, silicon nitride, sapphire, glass, quartz with the latter being crystalline contrary to glass.

According to another embodiment, the layer to be etched is a layer or a substrate made of SiOCH. The SiOCH can be porous or dense. This material has the advantage of having very low permittivity, in particular when it is porous.

According to an embodiment, the layer to be etched is a crystalline layer.

According to an embodiment the masking layer is a layer forming a hard mask.

The hard mask is for example an inorganic non-carbon hard mask. It can then be for example made of SiOx or SiNx and more particularly of SiO2 or SiN. It can also be a metal hard mask, for example made of TIN.

According to an embodiment the masking layer is arranged directly in contact with the layer to be etched.

According to an embodiment, the material of the hard mask is taken from among SiOx, SiNy. SiARC and TIN.

Advantageously, a hard mask will be used to produce patterns of small lateral dimensions that therefore require a low total opening in the mask and therefore a low mask thickness.

Alternatively, the masking layer is a layer of resin.

According to an embodiment, said at least one buffer layer has a base of silicon nitride (SiN) or base of silicon oxide (SiOx) such as silicon dioxide (SiO2).

Mentioned hereinafter are other optional characteristics that can possibly be used in association or alternatively.

According to an embodiment, the step of etching uses a solution of tetra methyl ammonium hydroxide (TMAH) or of hydrofluoric acid (HF), preferably under an oxygen atmosphere. This etching allows for very good selectivity of the modified areas with respect to non-modified areas. As such, the crystalline silicon of the layer to be etched is not or is very little consumed by this type of cleaning whereas the silicon rendered amorphous by the implantation is easily consumed.

According to an embodiment, prior to said sequence of eps, a step of producing at least one pattern in the masking layer is carried out.

In the framework of this invention, methods known to those skilled in the art and software (SRIM, TRIM, CTR-IM . . . ) can be used which make it possible to simulate according to the implantation conditions (species implanted, material implanted, dose, energy, exposure time of the layer implanted to the ion beam . . . ) the resulting implantation and in particular the implantation depth.

Advantageously, the implantation parameters, in particular the energy communicated to the ions, the duration and the dose of implantation, are provided in such a way that the implanted areas can be etched selectively with respect to the non-implanted areas. Preferably, these implantation parameters make it possible to pass the material from a crystalline state to an amorphous state.

Preferably, the implantation of species concerns all of the elements that can be implanted in the material to be etched, without causing any dislocation in its, atomic structure such that it would result in a spraying of the implanted material, can be suitable.

For example, the ions implanted are taken from hydrogen (H2), helium (He), argon (Ar) or nitrogen (N2). A single or several of these species can be implanted.

According to an embodiment, the implantation is carried out anisotropically, according to at least one direction of implantation substantially perpendicular to the plane wherein the layer to be etched extends or a substrate whereon is arranged the layer to be etched. In the figures, the privileged direction of implantation is the direction Z.

It is mentioned that in the framework of this invention, the term "on" "overlying", "cover" or "underlying" or their equivalents do not mean "in contact with". As such for example, the deposition of a first layer on a second layer, does not necessarily means that the two layers are directly in contact with one another but this means that the first layer covers at least partially the second layer by being either directly in contact with it or by being separated from it by at least one other layer or at least one other element.

In the framework of this invention, the thickness of a layer is taken according to a direction perpendicular to the main surfaces of the substrate whereon rests the various layers. In the figures, the thickness of taken along the direction Z indicated on the point of reference shown in FIG. 4a. In the figures, the width of a pattern is taken along the direction X indicated on this same point of reference.

Likewise when it is indicated that an area is located in line with a pattern, this means that this pattern and this area are both located on the same line perpendicular to the main plane of the substrate, or on the same line oriented vertically in the figures (axis Z).

In the framework of this invention, a three-dimensional (3D) pattern designates a pattern that has in a given layer, for example a resin or a substrate, an analog profile with a continuous variation of the tangents of the shape of the profile such as the profile 700 shown in FIG. 4h for example or having at least two levels of depth below the upper surface of the layer when the pattern is hollow or at least two levels of height above an upper surface of the layer when the pattern is protruding. A so-called 2D pattern designates the particular case of a pattern that only has two levels of height or of depth.

FIGS. 4a to 4h describe the steps of the method of the invention which make it possible to overcome the problems described hereinabove in prior art in order to produce in particular 3D structures but in a non-limiting manner, for example step profiles.

The method of the invention makes it possible indeed to produce, by means of a succession of steps of deposition of buffer layers with each one followed by ion implantation, molds with controlled curved shapes in order to obtain in particular aspherical microlenses. Particularly advantageously, this is done using a single operation of photolithography and successive depositions of buffer layers with each one followed by an implantation over a depth that is greater than the preceding implantation.

A precise control of the implantation conditions according to the thicknesses of the buffer layers then makes it possible to obtain optimum shapes of lenses for a given application using an inexpensive method. A major advantage of the method of the invention is indeed that it makes it possible to produce self-aligned structures using a single initial step of photolithography and therefore at lesser cost compared to the succession of steps of photolithography independent of the conventional method wherein the implanted surfaces have to be realigned with respect to one another at each step and with the disadvantages discussed hereinabove in the description of FIGS. 3a to 3f.

Figure 4A:
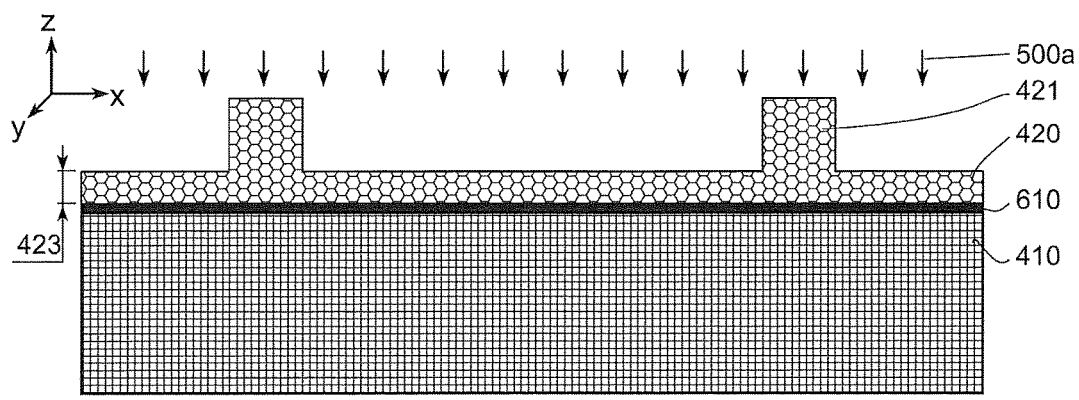
FIGS. 4a, 4b, 4c, 4d, 4e, 4f, 4g, and 4h describe the steps of an example of the method according to the invention which makes it possible for example to produce 3D structures with self-aligned steps.

As shown in FIG. 4a, a stack is more preferably used comprising at least a layer to be etched 410 and a masking layer 420 overlying the layer to be etched.

In the rest of the description, with a concern for concision and clarity, "substrate 410" designates this layer to be etched in which patterns are going to be formed. This term in no way limits the nature and the function of this layer. The terms "substrate", "layer to be etched" and "underlying layer" are as such equivalent.

The substrate 410 is for example made of silicon 410.

The masking layer 420 is a layer in which patterns can be formed by any one of the methods of lithography such as: photolithography or nanometric printing.

In the following examples, described in reference to FIGS. 4a-4h, 5, 6, and 7, the masking layer 420 is a hard mask or a layer of resin that is printable or that is photosensitive.

More generally, an organic or organo-mineral material that can be shaped by an exposure to an electron beam, of photons or of X-rays or mechanically is qualified as a resin. Mention can be made by way of example of resins conventionally used in microelectronics, resins with a base of polystyrene (PS), methacrylate (for example Polymethyl methacrylate (PMMA)), hydrosilsesquioxane (HSQ), polyhydroxystyrene (PHS) etc. The interest in using a resin is that it is easy to deposit therein a substantial thickness, of several hundred nanometers to several microns.

The masking layer 420 deposited on the substrate 410 has, according to this embodiment, a thickness 423 ranging from 50 nanometers (nm=10-9 meter) to a few microns (micron or μm=10-6 meter). The thickness of this masking layer 420, for example made of resin, depends in the shape and final critical dimensions of the structure sought.

The definition of initial patterns 421 in the resin 420 is done using steps of conventional photolithography that uses, for example, insolation equipment that operates in the ultra-violet (UV) range i.e. of the type: I-line 365 nm, DUV 248 nm, DUV 193 nm, or any other technique of lithography, for example, with electron beams or e-beams, self-aligned or DSA, or the lithography by nano printing. The choice is made according to the complexity and the dimensions of the initial patterns 421 to be formed.

If the masking layer 420 is a hard mask for example made of SiO2, SiN or TiN, conventional techniques are also used to define the initial pattern 421 which will then be covered with a buffer layer 430a-430n before each implantation 500b-500n.

Typically there is a deposition of a layer of resin on the masking layer 420 that forms a hard mask, then an initial pattern is defined by photolithography or by nano-printing in this resin before transferring this initial pattern into the masking layer 420 that forms a hard mask.

As shall be described in what follows, according to an optional embodiment, the structure comprises an intermediate layer 610 located between the masking layer 420 and the layer to be etched 410.

As shown in FIG. 4a a first implantation 500a of any type of species is carried out which makes it possible to modify the state of the material of the layer to be etched 410.

The implantation parameters, in particular the energy communicated to the ions, the duration and the dose of implantation, are provided in such a way that the implanted areas 411a-411n can be etched selectively with respect to the non-implanted areas 412.

The implantation consists in implanting in the layer to be etched 410 ions without causing any dislocation of its atomic structure such that it would result in a spraying of the implanted material.

According to a privileged embodiment, the implantation 500a makes it possible to render the substrate 410 amorphous in line with the initial patterns 421 which have been defined in the masking layer 420.

This is typically, as already mentioned hereinabove, an implantation of ions using hydrogen (H2) which results in a modification of the material of the area 411. Argon (Ar), nitrogen (N2) or helium (He) can also be used.

The implantation is carried out anisotropically, preferably according to at least one direction of implantation (axis Z in the FIGS. 4a-4h) substantially perpendicular to the plane (XY in the FIGS. 4a-4h) wherein the layer to be etched 410 extends or a substrate whereon is arranged the layer to be etched 410.

The thickness of the pattern 421, the nature of the masking layer 420 and the parameters of the implantation 500a are preferably chosen in such a way as to prevent, in line with the pattern 421, the modification of the layer to be etched 410. As such, in line with the pattern 421, i.e. under the pattern 421 according to the direction Z, the ions do not pass through the masking layer 420 to penetrate into the layer to be etched 410.

According to an embodiment, the material of the masking layer prevents the ions from passing through it. According to another embodiment, it is the thickness of the masking layer which is adjusted in such a way that the ions remain trapped within without penetrating into the underlying layer to be etched. In the embodiment wherein an intermediate layer 610 is located between the masking layer 420 and the layer to be etched 410, it is the thickness of this intermediate layer that can be adjusted in order to prevent the layer to be etched 410 from being modified in line with the patterns 421. This is a first advantage of this intermediate layer. Another advantage shall be described hereinbelow.

As such, the ions modify the layer to be etched 410 preferably only on areas that are not in line with the patterns 421 formed in the masking layer 420.

According to an alternative embodiment, the ions modify the layer to be etched 410 even in line with the patterns 421 formed in the masking layer 420. However the implantation depth in line with the patterns 421 is less than the implantation depth e500a of the areas that are not situated under the patterns 421.

With regards to the implantation equipment, several choices are possible:
- a dry etching reactor can for example be used wherein a plasma and more particularly those referred to as with inductive or capacitive coupling is formed;
- or then a conventional implanter referred to as in line with the beam;
- or then an implanter via immersion that combines the two preceding techniques.

The choice of the implanter depends on the type of structure to be produced and especially the depth e500-e500n to be implanted in the substrate 410.

In the following description, implantation depth means the maximum distance between the upper surface of the substrate 410 and the maximum depth at which the ions are implanted with a concentration that is sufficiently high so that the areas modified (411a, 411b, . . . , 411n) by implantation can be etched selectively to the non-implanted 412, that has a ratio of a difference in the etching speed that is strictly greater than 2 preferably greater than 10.

The depth is measured according to the direction Z. It is referenced as e500$a$ if it is the depth obtained after the step of implantation 500$a$. It is referenced as e500$n$ if it is the depth obtained after the step of implantation 500$n$.

In the case of the use of an etching reactor, the implantation depth of the ions is limited to a few tens of nanometers. Typically, the implantation can be done over a depth ranging from a few Angstroms (10-10 meters) up to a maximum of 100 nm. An implantation by forming a plasma of the CH4/He type, i.e, methaneihelium, in a proportion of 1/50 of these compounds, is in this case preferred as this type of plasma offers an infinite etching selectivity with respect to the resin (no significant etching is observed during the implantation) in the case where the masking layer 420 is made of resin. In the case where hydrogen is used, it is on the contrary observed that the latter chemically reacts with the resin and etches it during the implantation as such altering the dimensions of the patterns defined beforehand by photolithography as has been seen hereinabove. Moreover, the advantage with using an etching reactor for the implantation is that the modification of the substrate, its amorphization, is done without discontinuity over the entire depth e500 implanted, i.e. from the surface of the substrate 410 to the maximum depth of the implanted area. As such the step of cleaning that will follow and which is described hereinafter is very effective in removing all of the modified film.

With a conventional planter ions can be implanted at a greater depth, which can reach several hundreds of nanometers. However, the disadvantage of conventional implanters resides in the fact that it is difficult to implant on the surface. Indeed with conventional implanters there is a minimum energy of about 1 keV (kilo electronvolt) that inevitably causes a penetration of ions implanted in the substrate. The ions are therefore located at a distance from the surface of the latter, although this remains at a shallow depth. There is as such an area between the surface and this depth devoid or with a very low content of species implanted. This therefore does not make it possible for a surface modification, of a few nanometers, to be carried out.

The minimum implantation depth in these conditions is about 20 nm for hydrogen ions and 5 nm for an implantation using nitrogen.

The modification of the layer to be etched 410 is therefore not carried out in a perfectly continuous manner from the surface of this layer.

Figure 5:
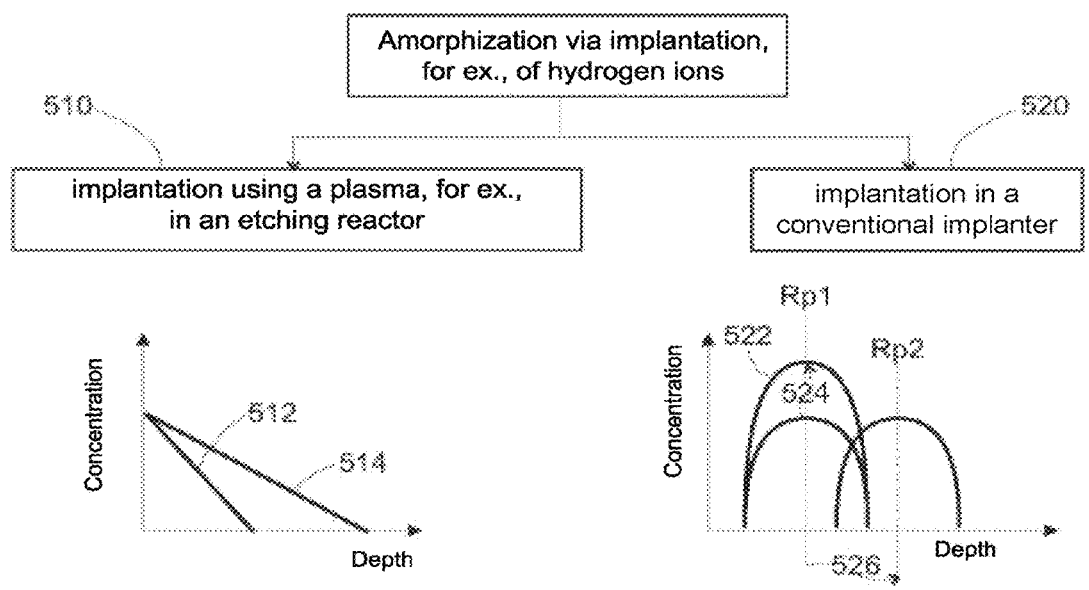
FIG. 5 compares the use of a conventional implanter and that of an etching reactor for the operations of ion implantation implemented in the framework of the invention.

Implantation profiles of hydrogen ions obtained, on the one hand, using a plasma in an etching reactor 510 and, on the other hand, in a conventional implanter 520, are shown for comparison in FIG. 5. In the first case, note that the concentration of ions decreases linearly 512 from the surface where it is therefore the highest. By adjusting the plasma so that the ions acquire a stronger energy, deeper depths are reached still with a decreasing linear profile 514.

In the case of a conventional implanter 520, the implantation is done around an average depth (Rp) where the concentration is maximum with a Gaussian profile on either side 522. It is then required to proceed with several implantations at different energies and therefore different depths (Rp1, Rp2) in order to cover the entire thickness to be modified of the substrate. Higher doses make it possible to increase the concentration 524 of the implanted ions. With the same dose, deeper depths are reached 526 by communicating to the ions a higher energy. Conventionally, the dose expresses the number of atoms implanted in the material per square centimeter.

In the framework of this invention, methods known to those skilled in the art and software (SRIM, TRIM, CTRIM . . . ) can be used that make it possible to simulate according to the implantations conditions (species implanted, material implanted, dose, energy, exposure time of the plate to the ion beam etc.) the resulting implantation and in particular the implantation depth.

A solution that makes it possible to use a conventional implanter and as such to overcome the problem of low energies delivered by this type of equipment is, as mentioned hereinabove, to an "intermediate layer" 610 or "buffer layer" 610 between the masking layer 420 and the substrate 410.

The thickness of the intermediate layer 610, which is at least 30 nm, then makes it possible to implant until the surface the substrate 410 even with ions accelerated with an energy of only 1 keV. In this type of reactor, the implantation is carried out at a given depth, noted as Rp as hereinabove. Around this depth Rp, the implantation area extends typically over a few dozen nanometers. In order to obtain a continuous modification of the substrate 410, from its surface to the desired depth, it is then required to provide a covering of the modified depths e500$a$-e500$n$ of the substrate 410 after each step of implantation 500$a$-500$n$.

As such during the implantation of the layer to be etched, made for example of silicon, the intermediate layer 610 covers the layer to be etched 410.

According to an embodiment the intermediate layer 610 is made of a carbon material such as resin.

According to another embodiment the intermediate layer 610 is made of a non-carbon material, such as for example SiARC (anti-reflection coating) or SixOy (SiO2 for example) or SixNy (SiN for example), or a metal mask such as TiN. In the case of SiARC it has for example a thickness of 100 nm for an implantation in the silicon constituting the substrate 410 which extends over a depth 413$a$ of 350 nm. In this case the masking layer 420 is preferably made of resin.

This embodiment with intermediate layer has a considerable advantage. Indeed, it, has been shown that the implantations 500$a$-500$n$ in the absence of an intermediate layer 610, in particular through a carbon masking layer 420 such as a layer of resin, induces a phenomenon that decreases the dimensional control of the shape obtained in the end and which degrades the quality of the material of the layer to be etched 410.

More precisely, in the absence of an intermediate layer 610, when the masking layer 420 is with carbon, the implantation sought in the layer to be etched 410 inevitably produces a displacement of the carbon atoms initially present in the masking layer 420 to the layer to be etched 410. In the framework of the development of this invention, it has been shown that these carbon atoms then form in the layer to be etched 410 a carbon-enriched surface film. This film generally has a thickness less than 20 nm and more often less than 10 nm according to the energy of the bombardment.

As such, the surface of the layer to be etched 410 is modified by the adding of carbon. Due to this modification of the surface of the layer to be etched, it is then no longer possible to correctly etch via wet etching the implanted area 411.

Indeed a wet etching via a solution of tetra methyl ammonium hydroxide (TMAH) or of hydrofluoric acid (HF) for example, will not make it possible to remove the areas modified by implantation as they have been enriched with carbon. It follows that the patterns of the masking layer are not faithfully reproduced in the layer to be etched. In particular, the flanks of the patterns of the layer to be etched 410 are not located in line with those of the masking layer 420. Moreover, the flanks of the patterns of the layer to be etched 410 are not vertical.

The dimensional control of the complex shape to be produced is therefore highly degraded.

In a more extreme case, the etching solution does not manage to etch the layer to be etched 410 with silicon if the surface of the latter has been excessively enriched with carbon.

The intermediate layer 610 protects the layer to be etched 420 from any addition of carbon. Indeed during the implantation, the carbon is stopped by the intermediate layer 610. The thickness of the latter is chosen in such a way that the carbon atoms do not pass through it. As such the intermediate layer traps the carbon atoms.

Another embodiment that makes it possible to prevent the adding of carbon in the layer to be etched 410 and which therefore makes it possible to improve the dimensional control of the final patterns, comprises the use of a masking layer 420 forming a non-carbon hard mask instead of a carbon masking layer.

This can be an inorganic hard mask, for example made of SiOx or of SiNx and more particularly of SiO2 or SiN. It can also be a metal hard mask, for example made of TIN.

As this is not a carbon hard mask, it does not transfer carbon atoms into the layer to be etched 420 during the implantation. A carbon-enriched film therefore does not form on the surface of the latter.

These two embodiments, using an intermediate layer 610 and a hard mask have for advantage allowing for a removal of the modified areas of the layer to be etched via TMAH.

An advantage of a wet etching is having better etching selectivity with the non-implanted portion than with other types of etching in particular via plasma. Plasma etching is indeed much more aggressive due to the bombardment. The invention makes it possible to obtain better dimensional control of the complex shape produced and better quality of the residual material of the layer to be etched 610.

Figure 4B:
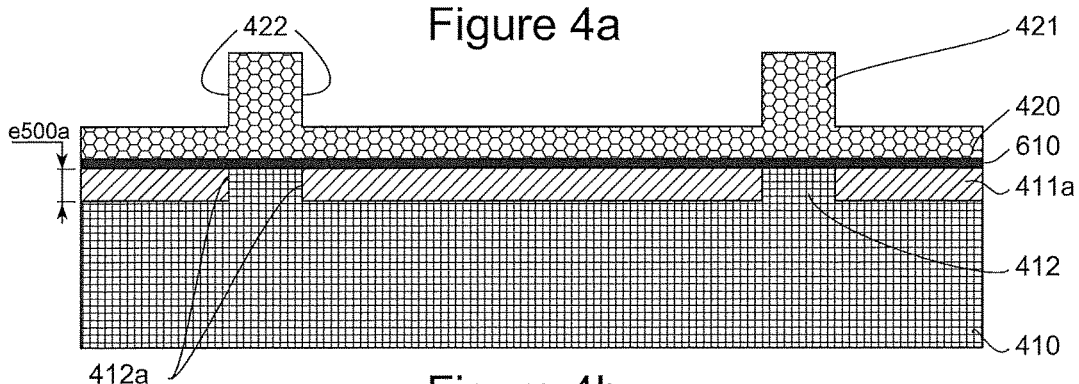

In reference to FIG. 4b, at the end of the first step of implantation 500, the following are thus obtained in the substrate 410:

Modified areas 411a by implantation over a depth e500a. These areas are not located plumb with patterns 421.

Non-modified areas 412 located plumb with patterns 421. These non-modified areas 412 extend from the surface of the substrate 410 as shown in FIG. 4b. Alternatively, and according to the conditions of implantation (energy of the ions and the nature of the ions in particular), the thickness of the pattern 421 and of the nature of the masking layer 420, it is possible for a surface portion of the substrate 410 to be modified. The depth of this modification will be less than the depth e500a of the modified, areas 411a located outside of the patterns 421.

The interface 412a between modified areas 411a and non-modified areas 412, or modified over a lesser depth, is located plumb with flanks 422 of the pattern 421, as shown in FIG. 4b, if the privileged direction of implantation 500 is perpendicular to the plane of the substrate 410.

Figure 4C:
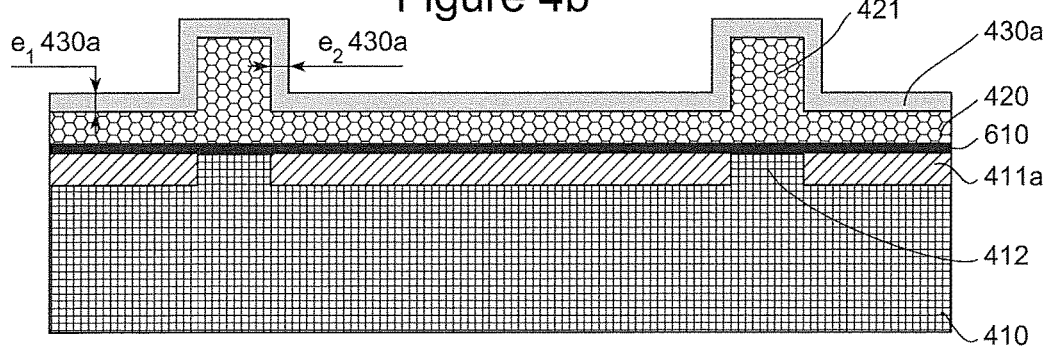

FIG. 4c shows a step of deposition of a buffer layer 430a. This buffer layer 430a covers the masking layer 420, preferably entirely. It in particular covers the pattern 421.

The buffer layer 430a covers in particular flanks 422 of the pattern 421 and also preferably its top.

More preferably the buffer layer 430a is a conformal layer. Its thickness is therefore constant over the entire surface of the stack, with this thickness being measured, at each point perpendicularly to the surface of the masking layer 420. As such the buffer layer 430a reproduces the profile of the masking layer 420. In particular, the thickness e1430a (taken according to the axis Z) of the buffer layer 430a outside of a pattern 421 is identical to the thickness e2430a (taken according to the X axis) of the buffer layer 430a on a flank 422 of the pattern 421.

The buffer layer 430a is for example with a carbon base. It is for example in this case made of carbon. Alternatively, the buffer layer 430a has a silicon base. It is, for example in this case, made of nitride such as silicon nitride (SiN) or of silicon oxide (SiOx) such as silicon dioxide (SiO2).

Preferably in order to obtain this conformal deposition the deposition of the buffer layer 430a is carried out in a deposition reactor for example using one of the following methods: PECVD (plasma-enhanced chemical vapor deposition), LPCVD (low-pressure chemical vapor deposition), ALD (atomic layer deposition), or PEALD (plasma enhanced atomic layer deposition).

The deposition can also be obtained in an etching reactor by using gases of the CxFyHz type, CxHy if it is desired to obtain a buffer layer with a carbon (C) base, or gases of the SiCl4, SiF4 or SiH4 type if it is desired to obtain a buffer layer with a silicon (Si) base. The advantage of carrying out this type of deposition in an etching reactor is that it is possible to carry out the two steps (implantation and deposition) in the same reactor and as such obtain a gain in productivity.

Figure 4D:
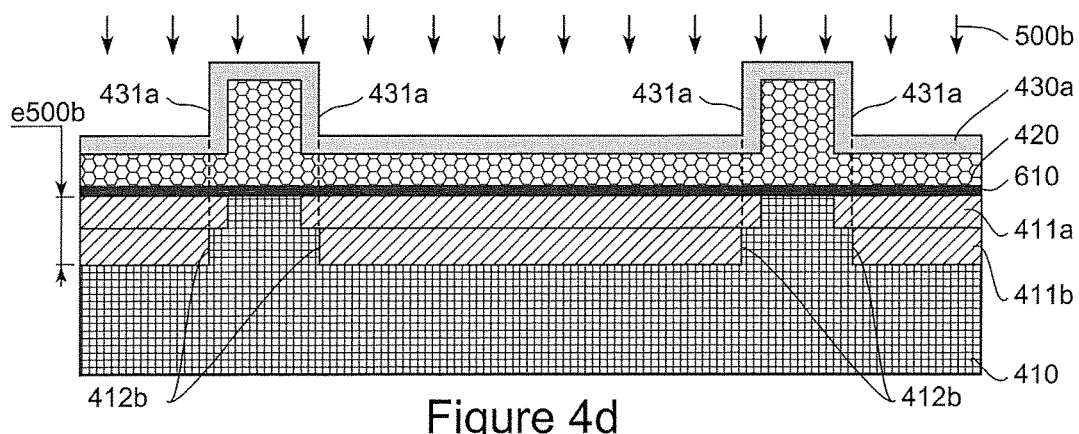

As shown in FIG. 4d, after having formed the buffer layer 430a, a step of implantation 500b is carried out through the buffer layer 430a and the masking layer 420 to modify the layer to be etched 410.

This implantation 500b is carried out over a depth e500b that is greater than the depth e500a. As such new areas 411b of the layer to be etched 410 are modified. Preferably, these new modified areas 411b overlap or partially cover (according to the direction of implantation Z) the areas 411a in such a way that the layer to be etched 410 is modified continuously between the various modified areas 411a-411b.

According to the axis X, the interface 412b between modified areas 411b and non-modified areas 412, or modified over a lesser depth, is located plumb with flanks 431a of the buffer layer 430a covering the pattern 421 as shown in FIG. 4d, of the privileged direction of implantation 500b is perpendicular to the plane of the substrate 410. The distance, according to the axis X, between this interface 412b and the interface 412a between modified areas 411a and non-modified area 412 corresponds to the thickness e2430a of the buffer layer 430a that covers the flanks 422 of the patterns 421.

As such, in reference to FIG. 4d, at the end of the second step of implantation 500b, the following is thus obtained in the layer to be etched 410:

Modified areas 411a and 411b by implantation over a depth e500a and e550b. These areas are not located plumb with patterns 421.

Non-modified areas 412, located plumb with patterns 421 over the depth e500a and located plumb with flanks 431a over a depth between the depth e500a and the depth e500b.

As such, it is indeed the same masking layer 420 that is retained between two steps of implantation 500a, 500b. Likewise, it is indeed the same pattern 421 used during a first step of implantation 500a that is retained before carrying out the deposition of the buffer layer 430a and a second step of implantation 500b. After implantation in line with the patterns carried by the masking layer 420, there is therefore no removal of this masking layer 420 for the redeposition of another carrying another pattern. The same masking layer 420 is retained and the at least one pattern 421 that it carries is enlarged if it is in relief or is shrunk if it is hollow by the deposition of the buffer layer 430.

As such, the patterns through which the successive implantations are carried out are all self-aligned on the initial patterns 421, which provides increased precision for the dimensions obtained in the end.

Note that the difference in depth between the depths e500a and e500b is not necessarily identical to the thickness e1430a of the buffer layer 430a. This embodiment is shown in FIG. 4d. This is for example due to the nature of the buffer layer 430a through which the ions penetrate more easily than through the masking layer 420. This can also be due to a modification of the implantation energy of the ions.

As shown in 4e, preferably a succession of steps of deposition/implantation is then carried out in order to achieve the final structure sought.

Figure 4E:
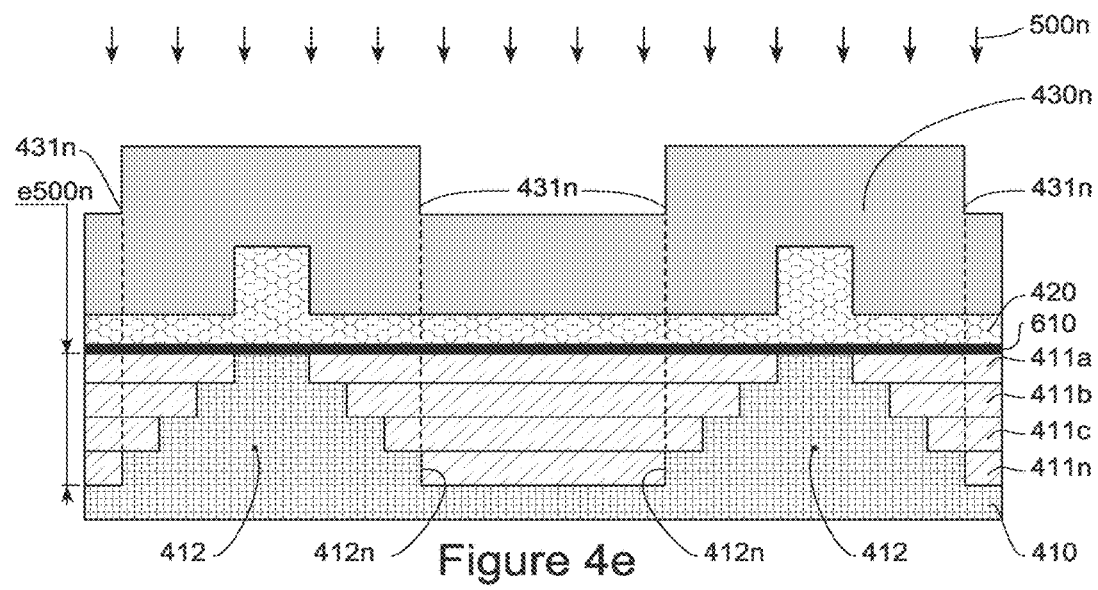
Figure 4F:
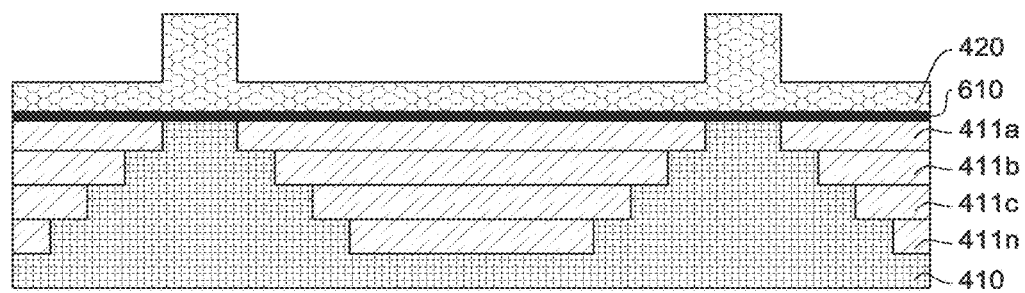
Figure 4G:
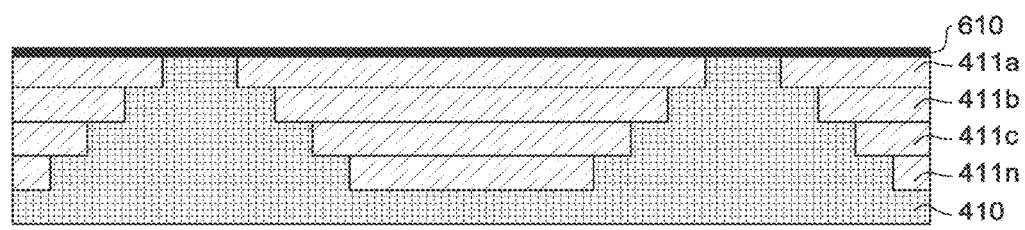
Figure 4H:
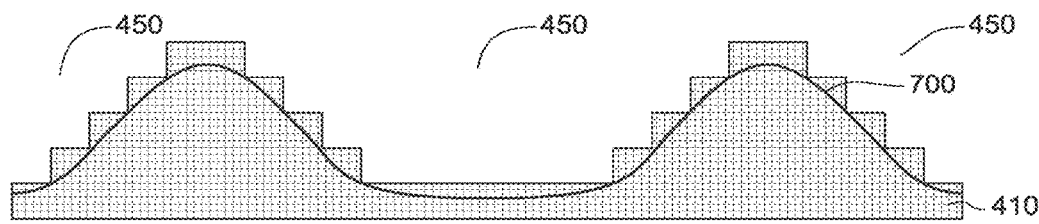

In more detail, the preceding operations, of the deposition of a buffer layer 430n then the implantation 500n, can be repeated using the initial pattern 421 in order to obtain an ion implantation profile in the substrate 410 having steps 450 such as the profile shown in FIG. 4h. By acting on the thicknesses of the buffer layers 430a-430n and of the implantation 500a-500n at each one of the steps profiles can be obtained with very different aspect ratios.

In FIG. 4e, the modified areas by implantation after each new deposition of a buffer layer 430 on the masking layer 420 are referenced as 411a-411n. Naturally during the implantation of the area 411n, an upper portion of the areas 411a-411c modified during the preceding steps of implantation is again implanted, with the implantation being carried out solid plate.

As shown in FIG. 4e, the interface 412n between modified areas 411n and non-modified areas 412, or modified over a lesser depth, is located plumb with flanks 431n of the buffer layer 430n covering the pattern 421.

Naturally, all of the characteristics and steps mentioned concerning the buffer layer 430a are valid for the other buffer layers 430b . . . , 430n.

Two embodiments in particular can be considered.

Figure 6:
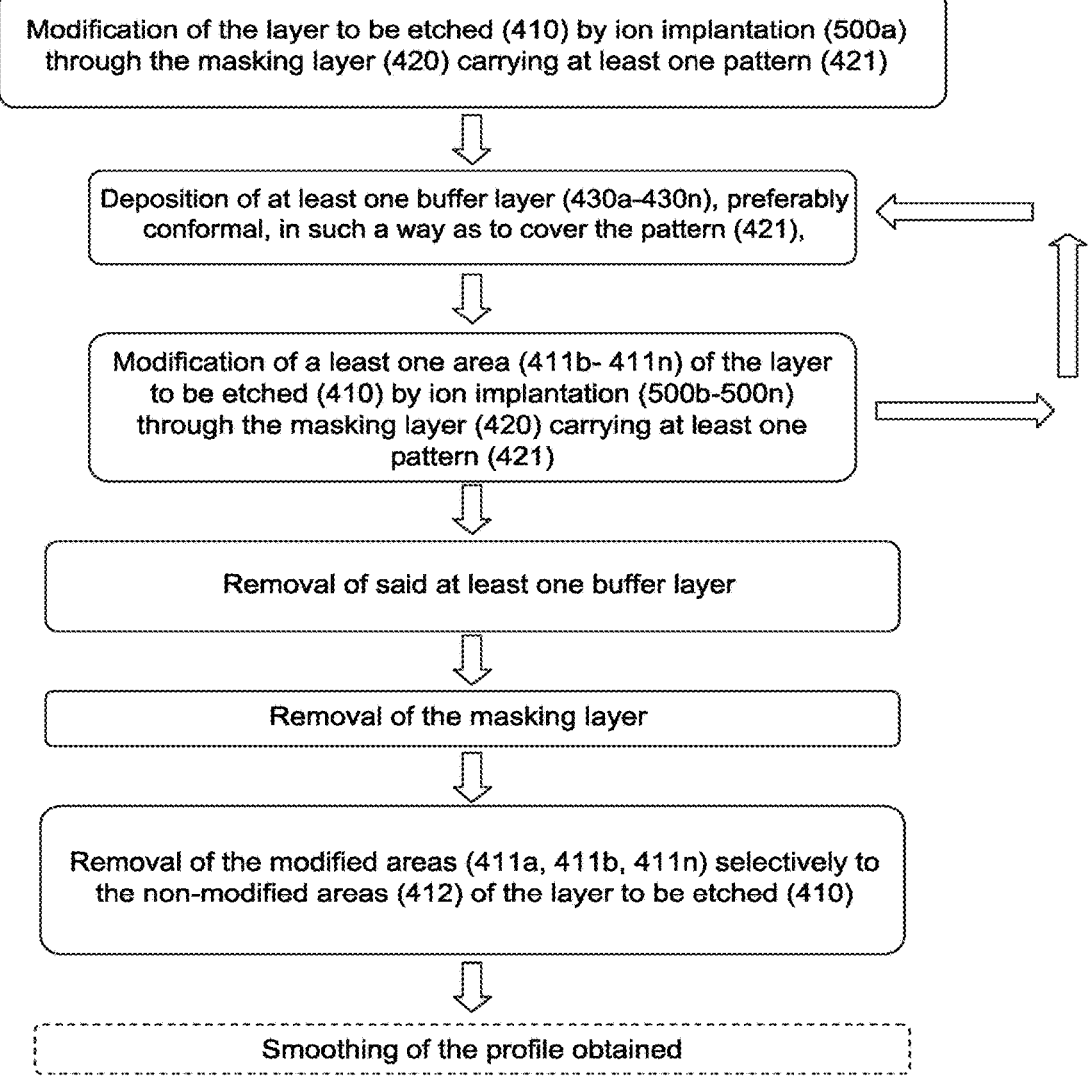
FIG. 6, shows the steps of a first example of a method according to the invention.

According to the embodiment, described in FIG. 6, after each implantation 500i through a buffer layer 430i, this buffer layer 430i is retained and the following buffer layer 430i+1 is deposited onto the preceding buffer layer 430i.

As such the total thickness of the layer formed by the stack of buffer layers automatically increases at each new sequence, with each sequence comprising a step of deposition and a step of implantation.

According to this embodiment, it is then possible to carry out the deposition of buffer layers 430i of identical thickness at each sequence.

This embodiment also has for advantage of having only a single step of removing for all of the deposited buffer layers 430a-430n.

Figure 7:
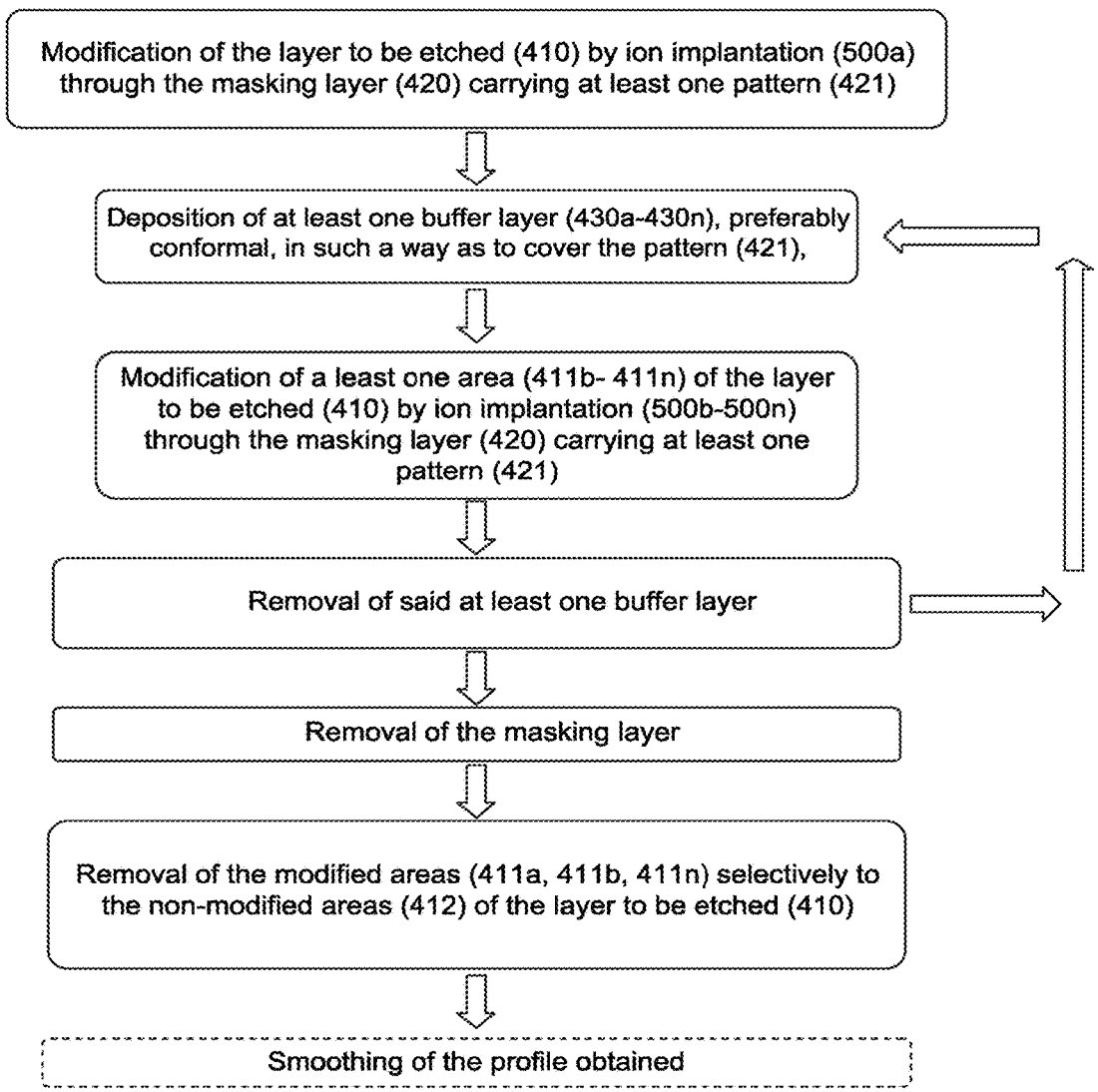
FIG. 7, shows the steps of a second example of a method according to the invention.

According to another embodiment, described in FIG. 7, after each implantation 500i through a buffer layer 430i, this buffer layer 430i is removed. The following buffer layer 430i+1 is then deposited onto the masking layer 420. This new buffer layer 430i+1 must then have a thickness greater than that of the preceding buffer layer 430i. As such, according to this embodiment each sequence comprises a step of deposition of a buffer layer, a step of implantation through this buffer layer and a step of removing this buffer layer.

In the following step shown in FIG. 4f, when the desired profile has been obtained, the stack of buffer layers 430a-430n deposited successively (embodiment in FIG. 6) is removed or the single buffer layer 430n if the successive buffer layers 430a-430n are removed after each implantation (embodiment in FIG. 7).

The step of removing this stack of buffer layers or of each buffer layer 430a-430n, when the buffer layer forms a hard mask is obtained more preferably via wet etching.

For example HF chemistry is used if the material of the buffer layer is SiO2 or SiN. H3PO4 chemistry is used if the material of the buffer layer is SiN.

If the material of the buffer layer has a carbon base, the removing is carried out in an etching chamber by using an oxidative or reductive chemistry.

As shown in FIG. 4g, then removes the masking layer 420. This step is perfectly known and controlled by those skilled in the art. When the masking layer 420 is made of resin its removal its conventionally carried out in an etching chamber by using an oxygen based chemistry or with a wet method by using a commonly-used chemistry referred to as SPM(H2SO4:H2O2) with a base of sulfuric acid (H2SO4) and oxygenated water (H2O2).

During this same step or via an additional step the intermediate layer 510 if it is present is also removed.

FIG. 4h shows the result of the following step where all of the areas 411a-411n are removed from the substrate that have been modified, i.e. most often made amorphous, by the successive operations of implanting 500a-500n ions.

The modified areas 411a-411n, leave room, after they are removed, to the cavities 450 that define in this non-limiting example a step profile.

The conditions for removing modified areas 411a-411n, are chosen so that there is no or very little consumption of the non-modified areas 412 of the substrate 410, i.e. with a consumption of the non-modified material that does not exceed a few nanometers per minute. Typically, if the substrate 410 is made of crystalline silicon, the silicon made amorphous is removed by the implantations, selectively to the crystalline silicon, by using a solution of tetra methyl ammonium hydroxide (TMAH) or of hydrofluoric acid (HF) under an oxygen atmosphere. The crystalline silicon is not or very little consumed by this type of cleaning.

FIG. 4h also shows the result of a smoothing of step profiles that can be carried out after the preceding step of removing the silicon that has been made amorphous. This step of smoothing is optional. It is therefore framed with a dotted line in FIGS. 6 and 7.

The profile obtained after smoothing is referenced as 700. For this smoothing a thermal oxidation of the silicon of the substrate 410 is carried out in order to form a layer of oxide in the range of thicknesses ranging for example from 10 nm to 2 μm. This operation of thermal oxide growth is followed by deoxidation and cleaning for example by wet method in a solution of hydrofluoric acid (HF). According to the thickness of the silicon oxide that is desired to be produced the growth conditions of this thermal oxide can for example be as follows:

thermal oxidation of thickness 200 nm using an annealing at 1000° C. under oxidizing atmosphere for 20 minutes;

thermal oxidation of thickness 1000 nm using an annealing at 1000° C. under an oxidizing atmosphere for 3 hours.

The removal of the SiO2 formed as such can be done by dissolution of the oxide by wet method in a solution of hydrofluoric acid (HF) diluted to 10%.

This step advantageously makes it possible to obtain a smoothing of the walls of the profile formed as such and/or to more precisely adapt its final dimensions.

This profile is for example able to form a mold, of which a possible application is the production via nanometric printing of an aspherical lens.

As indicated hereinabove the invention is particularly advantageous in the case where the layer to be etched 410 is made of silicon or one of the following materials: silicon germanium, germanium, silicon nitride, sapphire, quartz, glass.

According to yet another embodiment the layer to be etched 410 is made of carbon and hydrogen silicon oxide (SiOCH). This can be porous or dense SiOCH. This material has the advantage of having a very low permittivity, in particular when it is porous.

All of the embodiments described hereinabove can be applied to SiOCH.

In light of the description hereinabove, it clearly appears that the invention proposes a solution that is simple, reliable and easy to industrialize in order to produce possibly complex profiles and requiring the alignment of several operations of lithography.

The invention is not limited to the embodiments described hereinabove and extends to all of the embodiments covered by the claims.

The invention claimed is:

1. A method for producing patterns in a layer to be etched, from a stack comprising at least the layer to be etched and a masking layer overlying the layer to be etched, with the masking layer having at least one pattern, the method comprising:
   a) modifying at least one first area of the layer to be etched by ion implantation through the masking layer;
   b1) depositing at least one buffer layer so as to cover the at least one pattern of said masking layer;
   b2) modifying at least one second area of the layer to be etched, different from the at least one first area, by ion implantation through said at least one buffer layer, with the ion implantation through said at least one buffer layer being performed to a depth into the layer to be etched that is greater than an implantation depth into the modified at least one first area of the layer to be etched;
   c) removing said at least one buffer layer;
   d) removing the masking layer; and
   e) removing the modified at least one first area and the modified at least one second area by etching the modified areas selectively relative to non-modified areas of the layer to be etched.

2. The method according to claim 1, wherein the step b1) of depositing the at least one buffer layer is a conformal deposition.

3. The method according to claim 1, wherein, before the step c) of removing said at least one buffer layer, a sequence comprising the steps b1) and b2) is performed several times, with a buffer layer that is deposited during a given iteration of the sequence being stacked on another buffer layer deposited during a sequence preceding the given iteration of the sequence.

4. The method according to claim 1, wherein the masking layer is a resin or a hard mask, and comprises at least one material chosen from among the following materials: carbon, SiOx, SiNx, SiARC, and TiN, where x is a positive integer.

5. The method according to claim 1, wherein at least one of the ion implantations is performed with an implanter.

6. The method according to claim 1, wherein at least one of the ion implantations is performed in a plasma reactor.

7. The method according to claim 1, wherein the layer to be etched is a layer or a substrate, and comprises a material chosen from among the following materials: silicon, silicon germanium, germanium, silicon nitride, sapphire, quartz, glass, SiOCH, and porous SiOCH.

8. The method according to claim 1, wherein said at least one buffer layer has a silicon nitride (SiN) base, or has a silicon oxide (SiOx) a silicon dioxide (SiO2) base, where x is a positive integer.

9. The method according to claim 1,
   wherein, before the step d) of removing the masking layer, a sequence of the steps b1), b2), and c) is performed several times, and
   wherein a buffer layer that is deposited during a given iteration of the sequence has a thickness that is greater than a thickness of another buffer layer deposited during a sequence preceding the given iteration of the sequence.

10. The method according to claim 9, wherein said etching uses a solution with a tetra methyl ammonium hydroxide (TMAH) or a hydrofluoric acid (HF) base, under an oxygen atmosphere.

11. The method according to claim 1, wherein the steps b1) and b2) are performed such that the modified at least one first area and the modified at least one second area form a step profile, by selection of a thickness of the deposited at least one buffer layer and of a depth of ion implantation.

12. The method according to claim 11, wherein, after the forming of the step profile in the layer to be etched, a smoothing of said step profile is performed by oxidation and deoxidation of a material of the layer to be etched.

13. The method according to claim 1, wherein the stack further comprises an intermediate layer arranged between the masking layer and the layer to be etched, and covering the layer to be etched during the ion implantation through the masking layer.

14. The method according to claim 13,
   wherein the masking layer comprises carbon, and
   wherein a thickness of the intermediate layer forms a barrier that prevents, during the ion implantation through the masking layer, carbon species coming from the masking layer from penetrating into the layer to be etched.

15. The method according to claim 13, wherein a thickness of the intermediate layer is adjusted such that on the modified at least one first area and on the modified at least one second area, ions are implanted continuously into the layer to be etched from a surface of the layer to be etched.

* * * * *